United States Patent [19]
Khan

[11] Patent Number: 5,388,064
[45] Date of Patent: Feb. 7, 1995

[54] PROGRAMMABLE NON-VOLATILE ANALOG VOLTAGE SOURCE DEVICES AND METHODS

[75] Inventor: Sakhawat Khan, Santa Clara, Calif.

[73] Assignee: Information Storage Devices, Inc., San Jose, Calif.

[21] Appl. No.: 798,557

[22] Filed: Nov. 26, 1991

[51] Int. Cl.$^6$ .................... G11C 27/00; G11C 27/02
[52] U.S. Cl. ........................................ 365/45; 365/219
[58] Field of Search ............... 365/45, 219, 189.01, 365/189.05

[56] References Cited

U.S. PATENT DOCUMENTS

| | | | |
|---|---|---|---|
| 4,271,488 | 6/1981 | Saxe | 365/45 |
| 4,369,504 | 1/1983 | Hanmura | 365/219 |
| 4,558,431 | 12/1985 | Satox | 365/45 |
| 4,627,027 | 12/1986 | Rai et al. | 365/45 |
| 4,718,039 | 1/1988 | Aichelmann, Jr. et al. | 365/219 |
| 4,809,223 | 2/1989 | Brown | 365/45 |
| 4,890,259 | 12/1989 | Simko | 365/45 |
| 4,903,239 | 2/1990 | Akashi | 365/189.01 |
| 4,910,706 | 3/1990 | Hyatt | 365/182.01 |
| 5,034,922 | 7/1991 | Burgess | 365/189.05 |
| 5,126,967 | 6/1992 | Simko | 365/189.09 |
| 5,146,577 | 9/1992 | Babin | 365/219 |

OTHER PUBLICATIONS

"Single Chip Voice Message System, Preliminary Specification"; ISD 1016 Series; Information Storage Devices, Inc., Aug. 1991.

Primary Examiner—Eugene R. LaRoche
Assistant Examiner—Tan Nguyen
Attorney, Agent, or Firm—Blakely, Sokoloff, Taylor & Zafman

[57] ABSTRACT

Programmable non-volatile analog voltage source devices and methods wherein analog voltages may be sampled and stored in a non-volatile manner for output, typically through parallel output buffers. In one form and in a single integrated circuit, an input provided to the circuit may be stored at any analog storage location as determined by an address also provided to the circuit, the storage location determining at which of the outputs of the circuit the stored value will appear. While the storage, achieved by way of storage of differential voltages in floating gate MOSFET devices, is non-volatile, the same is also electrically alterable as desired. Various alternate embodiments and methods including the ability to address multiple pages of analog storage locations for storage of analog signals and selective parallel output of each page of the storage, output enable capabilities, parallel inputs and digital inputs are disclosed.

38 Claims, 7 Drawing Sheets

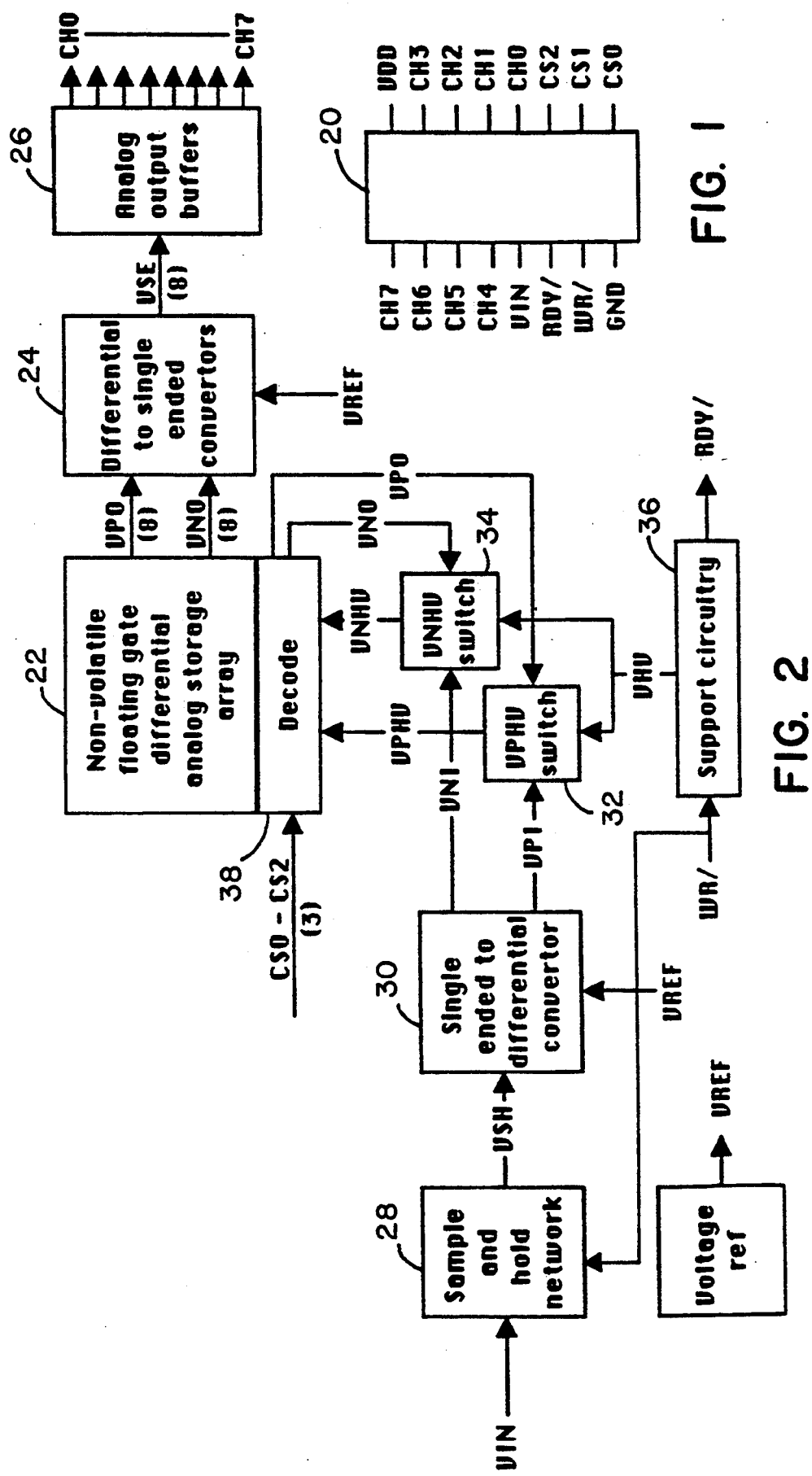

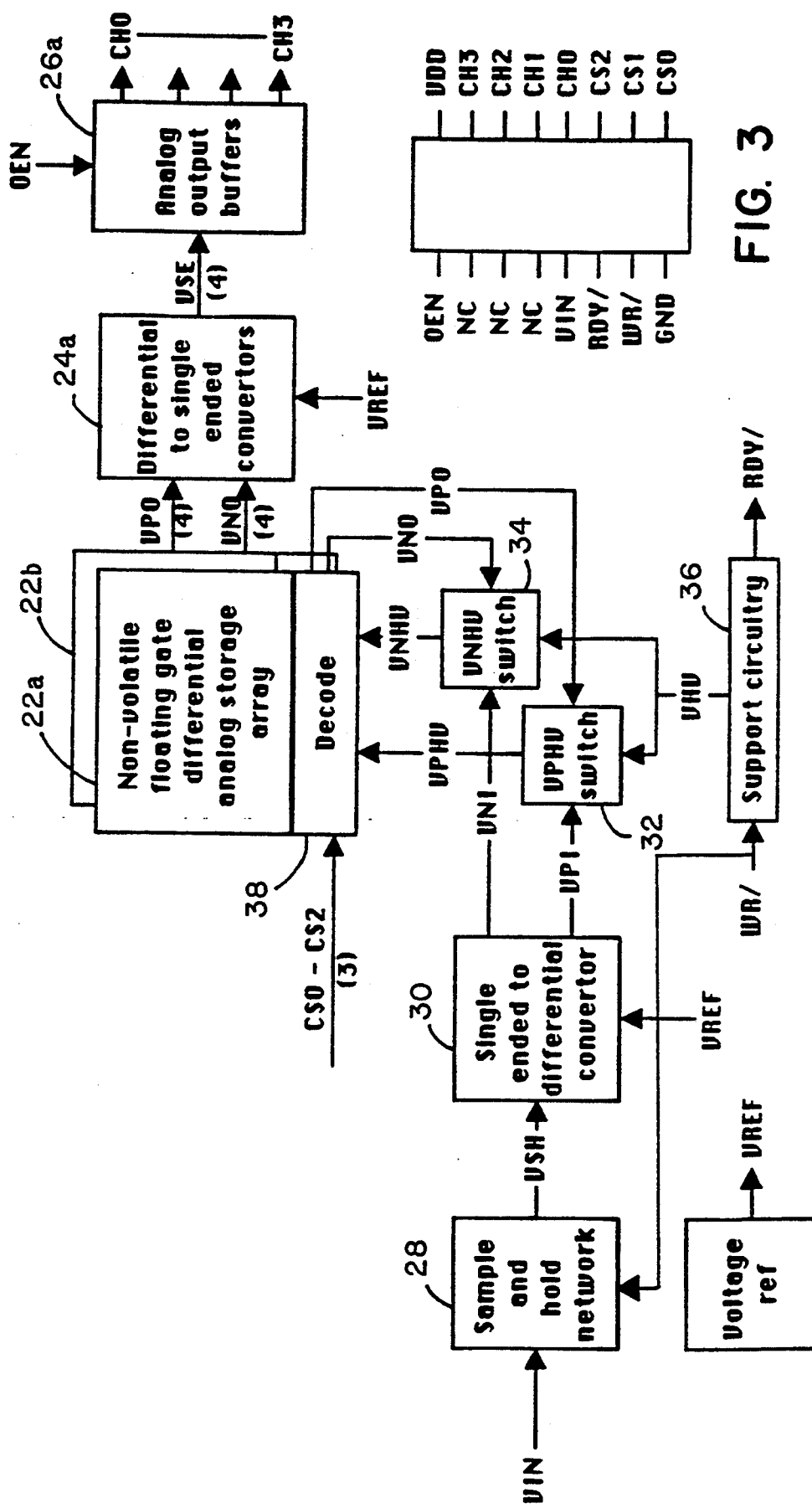

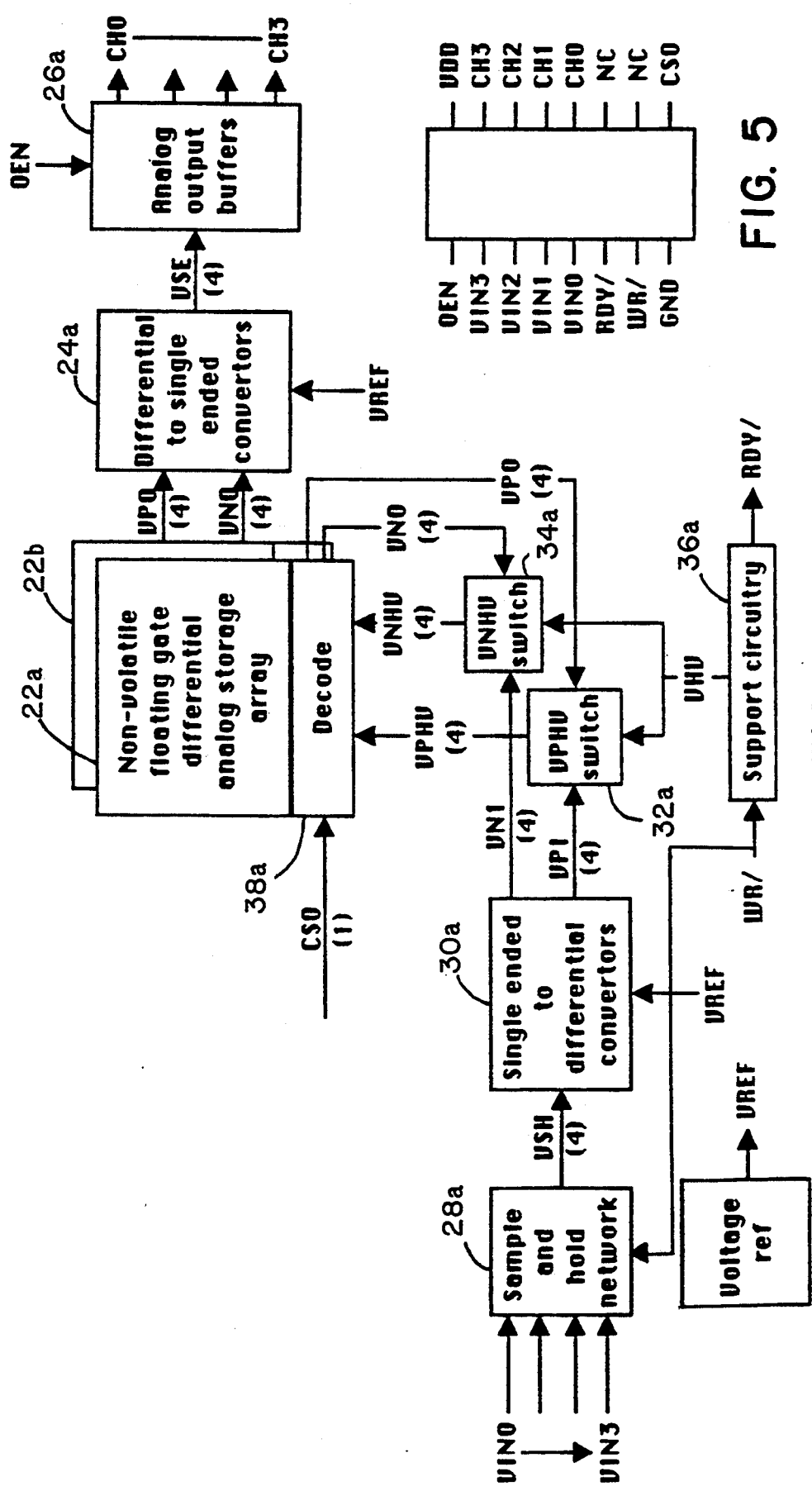

PROGRAMMABLE NON-VOLATILE ANALOG VOLTAGE SOURCE DEVICES AND METHODS

BACKGROUND OF THE INVENTION

1. Field of the Invention

The present invention relates to the field of analog voltage storage and output devices, and circuits and methods of sensing, storing and outputting analog voltages.

2. Prior Art

In the domain of analog electronics there is often a need for programmable DC analog voltages for system trimming, system control and system parameter setting applications. These voltages typically are set through the use of mechanical trim potentiometers (trim pots) or through digital to analog convertors (DACs) where digital bits are used to set the proper analog voltage storage through some form of digital to analog convertor, or through sample and hold networks for short term analog storage. Most such systems require more than one programmable voltage source, and in fact, some may need more then 100 such as an automatic tester. Some systems go through one time factory programming of these programmable voltage sources, other systems frequently set these voltage sources under user control, and yet other systems routinely perform auto calibration functions under the control of a microprocessor. The programming of the voltage sources are normally performed for various reasons, e.g.: compensating the long term system parameter drift, trimming the manufacturing tolerances of various components of a system in order to achieve optimum system performance or controlling the functionality of the multi-purpose programmable systems.

Mechanical trim potentiometers are bulky and expensive, are sensitive to mechanical vibration and are effected by the high solder temperature they are exposed to during surface mount pc board bonding. Layout of a pc board and packaging also becomes cumbersome, since physical access routes for the mechanical adjustment probes have to be allowed for. Sample and hold networks avoid most of these problems, but have the problem of charge leakage, whereby frequent refreshing is required. Digital storage of analog voltages together with multiple digital to analog convertors when integrated in monolithic form use a lot of silicon real estate, hence, are expensive. Both the sample and hold networks and the digital to analog convertors are volatile voltage sources, in that sample and hold networks have to be refreshed frequently, and the input bits for digital to analog convertors have to be held fixed, respectively. For the multi DAC systems, non-volatility is achieved through the use of some kind of non-volatile storage media (EEPROM, EPROMs, disk, etc.) to hold the input digital bit status.

What is required is a multi-output programmable non-volatile analog DC voltage source system which is small, is reliable and is a cost effective solution.

U.S. Pat. No. 4,890,259, assigned to the assignee of the present invention, discloses a high density integrated circuit analog signal recording and playback system based on an array storing analog signals. The array has rows and columns of non-volatile memory cells to store the signal information. Analog column read/write circuitry is used to both store the analog information and retrieve it on a real time basis, using interleaving of analog information on a plurality of sample/hold circuits prior to storage in the array to increase throughput.

Recently, the assignee of the present invention introduced a non-volatile analog storage chip of the foregoing type known as the ISD 1016. The single chip ISD 1016 is designed to record and play back analog signals, and includes on-chip, analog signal conditioning circuits and digital control functions to form a complete monolithic recording system in a single 28-pin package. A non-volatile storage array based on production-proven CMOS EEPROM technology stores the sampled signals for 10 or more years without power. The integration of all the components required for recording analog signals is made possible by the significant increase in storage density over digital techniques. For storing, the devices will operable directly from a microphone or similar transducer, and for playback will directly drive a speaker. Full digital addressable messages are easily accessed to provide the capability of constructing messages from stored words, and a plurality of 1016 devices can be connected together for increased storage and playback time.

BRIEF SUMMARY OF THE INVENTION

Programmable non-volatile analog voltage source devices and methods wherein analog voltages may be sampled and stored in a non-volatile manner for output, typically through parallel output buffers. In one form and in a single integrated circuit, an input provided to the circuit may be stored at any analog storage location as determined by an address also provided to the circuit, the storage location determining at which of the outputs of the circuit the stored value will appear. While the storage, achieved by way of storage of differential voltages in floating gate MOSFET devices, is non-volatile, the same is also electrically alterable as desired. Various alternate embodiments and methods including the ability to address multiple pages of analog storage locations for storage of analog signals and selective parallel output of each page of the storage, output enable capabilities, parallel inputs and digital inputs are disclosed.

BRIEF DESCRIPTION OF THE DRAWINGS

FIG. 1 is is a diagram illustrating the pinouts of one embodiment of the present invention as embodied in a single integrated circuit.

FIG. 2 is a block diagram of the embodiment of the present invention of FIG. 1.

FIG. 3 is is a diagram illustrating the pinouts of an alternate embodiment of the present invention as embodied in a single integrated circuit.

FIG. 4 is a block diagram of the embodiment of the present invention of FIG. 3.

FIG. 5 is is a diagram illustrating the pinouts of another alternate embodiment of the present invention as embodied in a single integrated circuit.

FIG. 6 is a block diagram of the embodiment of the present invention of FIG. 5.

DETAILED DESCRIPTION OF THE INVENTION

Figure 7:
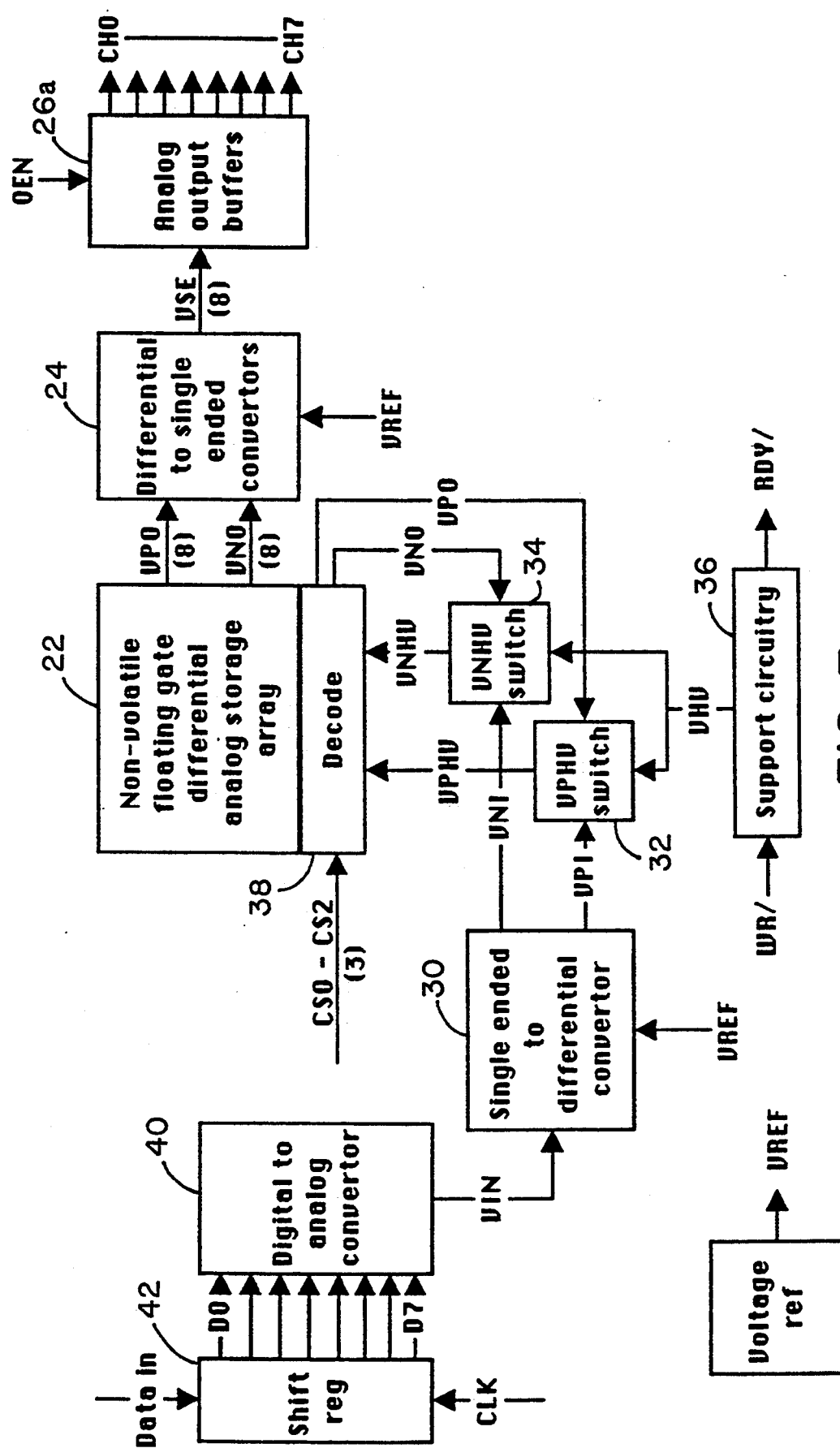
FIG. 7 is a block diagram of a still further alternate embodiment of the present invention.

The present invention is perhaps best described by first describing both the characteristics and organization of a typical preferred embodiment of the invention. Thereafter, other embodiments and design details will be described, which design details in most cases may readily be applicable to any of the embodiments described.

Thus, first referring to FIGS. 1 and 2, an integrated circuit as might be packaged in a dual in-line (DIP), SOIC or a PLCC package, and a block diagram for the circuitry therewithin, respectively, may be seen. The integrated circuit, generally indicated by the numeral 20 in FIG. 1, contains therein a non-volatile floating gate differential analog storage array 22, which in this embodiment has a capability of storing in differential form eight analog voltages. For output purposes, the eight differential voltages are provided to eight differential to single ended convertors 24 which provide eight single ended analog voltage outputs, which in turn are buffered by analog output buffer amplifiers 26 to provide eight low impedance analog voltage outputs CH0 through CH7.

For purposes of programming the integrated circuit of FIGS. 1 and 2, each analog voltage to be stored is individually sampled and stored one at a time, and similarly any one stored analog voltage may be changed at any time without disturbing the other stored voltages by merely writing a new value to the storage location of the desired output channel. In that regard, as shall subsequently be described herein in greater detail, each write operation to the floating gate differential analog storage array 22 is preceded by an erase cycle, so that a previously stored value at a given location will not affect the storage of a subsequent value at that location, whether of a higher or lower voltage. Thus, as may be seen in FIG. 2, an input voltage VIN is provided to the sample and hold network 28. When a write operation is initiated through control of the write signal WR/, the sample and hold network 28 samples the input voltage VIN and provides a sampled and held output voltage VSH to a single ended to differential convertor 30. The differential convertor in turn provides differential output voltages VPI and VNI with the differential voltage therebetween VPI-VNI being proportional to the input voltage VIN. VPI increases and VNI decreases with respect to VREF for an increased output of the sample and hold network output VSH.

The outputs of the single ended to differential convertor 30 are provided to high voltage switches 32 and 34, which are controlled by the support circuitry 36 to store the differential voltages at a given storage location in the analog storage array 22 as determined by the three-bit address CS0 through CS2 provided to the decoder 38 for the array. Note that in such an embodiment, each storage location is comprised of two storage cells, one for the storage of the voltage VPI and the other for the storage of the voltage VNI. Differential storage in this matter is advantageous as the individual storage cells, being formed by the same process on a single integrated circuit chip, will track each other well. Consequently, any drift in the programmed voltage in any one cell due to temperature, time or other factors will be well matched by an equal drift in the other associated cell, so that while the absolute value of the programmed voltage in any one cell may drift significantly, the differential between the two storage cells at a given storage location (e.g. storage address) will be minimal. Further, differential storage in this manner also provides substantial rejection of power supply noise as well as other common mode sources of error.

Another embodiment of the present invention may be seen in FIGS. 3 and 4. In this embodiment, a non-volatile floating gate differential analog storage array 22 is again comprised of eight storage locations, but this time logically organized as two planes or pages 22a and 22b, each of four storage locations. In this case, the differential to single ended convertors 24a convert four differential signals to four single ended signals, with the analog output buffers 26a converting the same to the four single ended low impedance voltage outputs CH0 through CH3. Thus, in this case, one bit of the address CS0 through CS2, typically the most significant bit, is used to control which of the two pages of four analog signals are to be provided at the outputs CH0 through CH3. In that regard, in this embodiment, the analog output buffers 26a include an output enable OEN which may be used to enable or disable the outputs, the disabled condition providing open circuit outputs so that if desired, any or all of the four outputs may be connected in parallel to similar or other devices as desired, so long as conflicting devices are not enabled at the same time. Further, of course, while FIGS. 3 and 4 only illustrate two pages of analog signal storage, any number of pages may be provided as desired. In that regard, as may be seen in FIG. 3 for a sixteen pin package for the implementation of FIG. 4, three pins have no connections. Accordingly, two more pages of analog storage and output could be provided by merely adding one more bit of address, etc. Further, one could readily provide additional output channels per page if desired. Also, in the embodiment shown in FIGS. 3 and 4, one could effectively disable the output enable on the analog output buffers if desired by merely tying the same to the ready pin RDY /. In particular, the RDY/ signal is asserted as soon as a write operation to the analog storage array has been completed, and accordingly, if tied to the output enable pin OEN, would enable the outputs at all times except when the analog storage data was being created or revised.

Now referring to FIGS. 5 and 6, a still further embodiment may be seen. This embodiment, like that of FIGS. 3 and 4, utilizes two pages of four differential analog storage locations to provide two pages of four analog voltage outputs as controlled by the output enable OEN. However, in this embodiment, four input voltages VIN0 through VIN3 are simultaneously sampled and held by the sample and hold networks 28a during a write operation as controlled by the write signal WR /. Thus, during a write operation, the four analog signals are sampled, then converted to four differential signals by the single ended to differential convertors 30a, to be parallel loaded into the non-volatile floating gate differential analog storage array as controlled by the "address" thereto. In that regard, note that in essence, an entire page of analog voltages is stored in the array at once, so that in this exemplary embodiment, only a single "address" bit CS0 is required, though of course as may be seen from FIG. 5, a sixteen pin package will readily accommodate up to three such address bits, so that up to eight pages of analog voltage storage could be provided if desired. Alternatively, additional channels could be provided if desired. In that regard, obviously larger packages (more pinouts) may also be used for larger and/or more pages as desired.

The embodiment of FIGS. 5 and 6, or other embodiments accepting parallel inputs, are advantageous in applications where multiple analog voltages to be stored are simultaneously available, and particularly advantageous in applications where the relationship between various analog voltages at any given time is more important than the absolute value of the same analog voltages taken at different times.

Now referring to FIG. 7, one still further embodiment of the present invention may be seen. This embodiment is similar to the embodiment of FIG. 2, though includes an output enable on the analog output buffers 26a. However, the single ended to differential convertor 30 of FIG. 7 is operative not from the output of a sample and hold circuit, but rather from the output of a digital to analog convertor 40 responsive, in this embodiment, to an eight bit digital signal provided thereto. This eight bit digital signal may be provided to the digital to analog convertor various ways, such as, by way of example, by direct connection of the digital to analog convertor input to an eight bit bus or eight bits of a larger bus. Thus, in any integrated circuit form, the digital to analog convertor would be included on the chip, with the eight inputs D0 through D7 thereto being provided through pin connections on the integrated circuit package. In the specific embodiment shown in FIG. 7 however, also included on-chip is a shift register 42 for receiving as the DATA IN signal under control of the shift in clock signal CLK, an eight bit serial signal for loading the shift register to provide the eight bit parallel output to the digital to analog convertor 40.

The embodiments of the present invention utilizing a digital input, whether a parallel input to the digital to analog convertor 40 or a serial input to a shift register 42, have various advantages over prior art techniques using digital to analog convertors to convert a digital signal to an analog voltage. In particular, it will be noted in FIG. 7 that a single on-chip digital to analog convertor 40 is used to store in this embodiment, eight analog voltages. Also, such analog voltages once stored in this embodiment (or any of the other embodiments of the present invention) are non-volatile, and may be immediately available on power up of a system without reloading the same into the analog storage memory. Further, the digital input devices of the present invention such as described with respect to FIG. 7 are single chip non-volatile integrated devices, not requiring digital to analog convertors for each analog output to be provided, not requiring separate registers for holding the digital input information for each digital to analog convertor, and not requiring separate non-volatile memory devices and various other separate integrated circuits and discrete components to achieve the desired result. The embodiments utilizing a digital input are highly usable, for instance, in various systems such as sensing and data acquisition systems, since many such systems, while processing and storing digital signals under processor control, still rely on analog sensors and transducers requiring analog voltages to set biases, null offsets, etc.

The embodiments of FIGS. 1 and 2 illustrate one form of implementation of the system which may be referred to as Octal Sample and Infinite Hold Analog voltage storage systems. These embodiments have eight programmable non-volatile analog DC voltage source outputs (CH7-CH0). The programming of the voltage sources is performed by the selection of the proper voltage source through the channel select inputs CS2-CS0, and by applying the proper analog level at the VIN pin, either directly or through an appropriate digital to analog interface. When the WR/ is pulled low, the analog level at VIN is sampled by the sample/hold network and at the same time a write cycle is initiated to write the sampled analog voltage level to one of the non-volatile storage elements as selected by the channel select inputs CS2-CS0. At the end of the write cycle, the RDY/ pin goes low and the stored analog voltages from the array are simultaneously available at the outputs through the analog output buffers. The analog output buffers, which may have an enable control, provide a low impedance voltage sourcing function. The Support Circuit Block contains all the necessary circuitry to perform the storage of the analog voltage level from the input of the single ended to differential convertor into one of the floating gate analog storage cells in the array as selected by the channel select pins CS2-CS0. The control-address interface logic (part of the support circuitry) performs the internal digital control functions and the sequencing functions. Test logic (not shown) is also provided for the ease of full function production testing of the system. As stated before, this system implementation has a number of advantages over conventional implementations of multi-channel sample and hold networks. Since the voltages are stored in floating gate storage cells, the stored voltages are non-volatile, whereas in conventional implementations, voltages are stored on capacitors, which leak and hence frequent refreshing is required to hold the voltages accurately. Also to increase the hold accuracy of the voltage over longer periods, large capacitors external to the monolithic implementation are invariably used. This makes the system bulky and unreliable. The described implementations are complete monolithic systems, making the system very small in size, which relates directly to cost.

The embodiment of FIG. 7 shows an implementation where the sample/hold block has been replaced with an 8-bit digital to analog convertor. In this form the system operates as an Octal Digital to Analog convertor (DAC) system, the floating gate analog storage cells emulating the function of DACs.

There are also a number of advantages of this system over conventional multi DAC monolithic systems. The present system is a non-volatile system. Conventional multi DAC systems are volatile. In conventional systems, the input digital bits have to be held in separate non-volatile memory to achieve non-volatility, making the system non-monolithic. The present implementation is very small in monolithic form compared to the conventional monolithic forms, which relates directly to the cost. Also the cost of implementing additional emulated DACs in the monolithic form is much lower for the present system as compared to the conventional implementation. For the present system each additional DAC is just one floating gate analog storage cell and one analog output buffer, whereas for the conventional systems it means one full DAC and one analog output buffer. This means for monolithic implementations of large number of DACs (e.g., 16), the present systems will cost much less because the die size will be small with higher yields.

Note also that pairs of floating gate cells will be used to store the analog voltages in fully differential fashion. This has advantages of not requiring any references, is less sensitive to system noise and is also less sensitive to temperature effects. Also more accuracy is achieved because a wider dynamic range is available through the fully differential implementation, within the limited supply range (5 V system).

Figure 8:
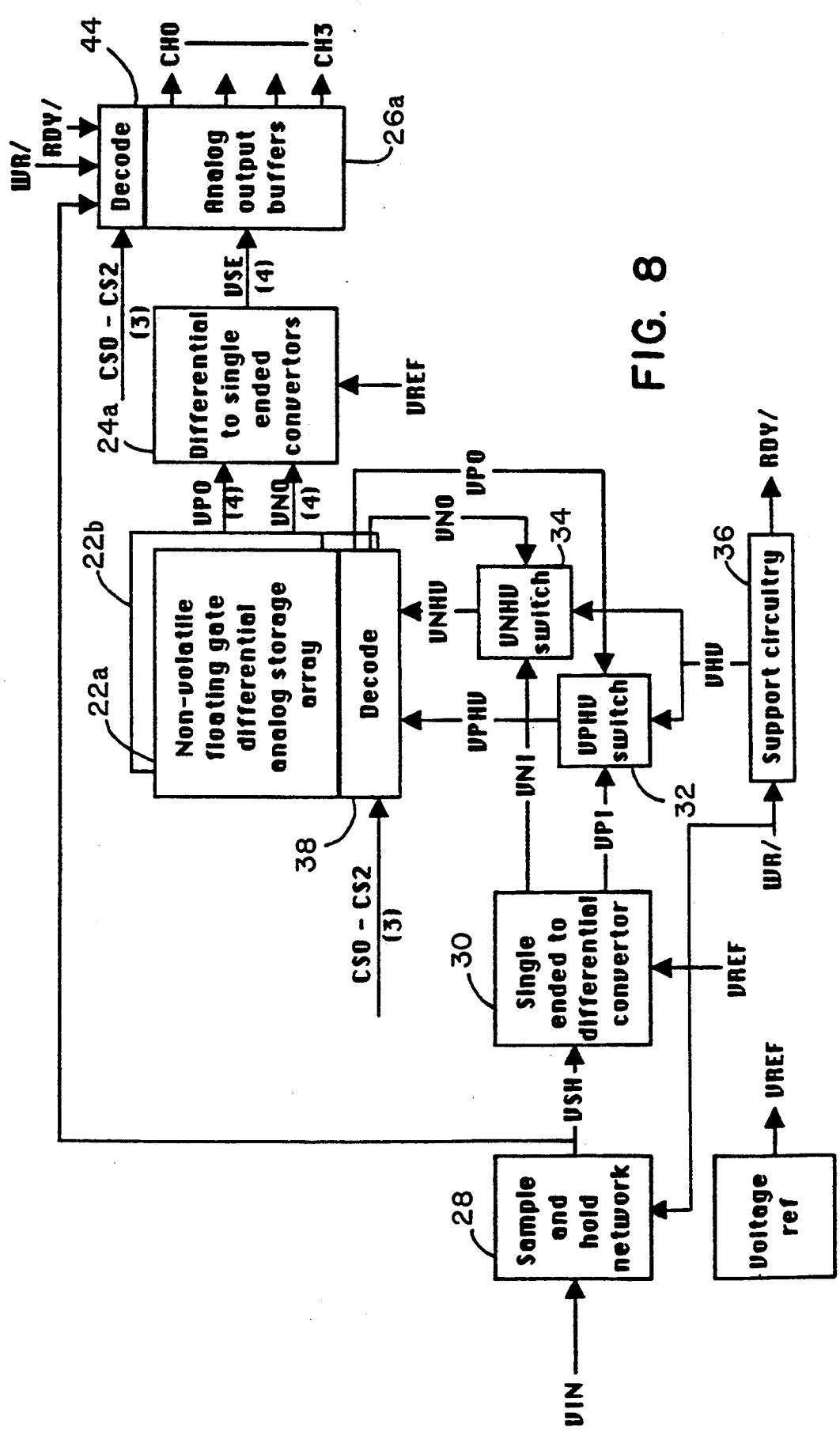
FIG. 8 is a block diagram of another preferred embodiment which allows the sample and hold output VSH to be output directly to a selected analog output buffer, allowing the user to choose the appropriate VIN voltage that would set the proper stored voltage at the output CH of the selected channel such that a certain desired parameter in a system gets tuned or nulled.

A block diagram of another preferred embodiment is shown in FIG. 8. The decode block 44 allows the sample and hold output VSH to be output directly to a selected analog output buffer. This condition will occur in the so called track mode, whenever the write signal WR/ is high. In this track mode (WR/ high), the voltage VSH at the output of the sample and hold network 28 follows the input voltage VIN. Also at the same time the VSH voltage is passed to the respective analog output buffer as selected by the channel select inputs CSO-CS2 through the decode block 44. When the write signal WR/goes low, the internal storage routine starts and continues until the RDY/ signal goes low. RDY/ going low signifies that the VSH voltage has been successfully stored in one of the selected non-volatile storage locations. At this time, the input of the selected output buffer gets switched from the VSH input to the output of the selected non-volatile analog storage cell. Note that the selected analog output buffer gets switched to the internal storage cell output from the sampled and held VSH signal (VSH sampled at the time WR/ goes low) only when RDY/ goes low. This track mode feature allows the user to choose the appropriate VIN voltage that would set the proper stored voltage at the output CH of the selected channel such that a certain desired parameter in a system gets tuned or nulled. Note also that this track mode feature can be included in all the other preferred embodiments described, as desired.

In the embodiments of FIGS. 2, 4, 6 and 8, voltage Vsh is the input to a single ended to differential convertor network (VIN in the embodiment of FIG. 7). The single ended to differential network generates two voltages Vpi and Vpn. The following equations show the relationship between Vsh, vref, vpi and Vpn.

Vpi=(Vsh−Vref)/AV+Vref  AV=Attenuation Factor

Vpn=(Vref−Vsh)/AV+Vref

This implies that the Vsh voltage will be symmetrically generated around Vref. The attenuation factor (Av) can be chosen suitably to provide optimum dynamic range utilization of the non-volatile storage range. Similarly, the Vref (reference voltage) can also be suitably chosen for optimum dynamic range utilization. The differential voltages (Vpi, Vpn) then go to the respective high voltage switches (Vphv switch, Vnhv switch). The high voltage switches Vphv switch and Vnhv switch either turn ON to let the high voltage programming voltage Vhv (generated by the support circuit block) to pass on as Vphv and Vnhv programming high voltages respectively, or turn OFF to block the Vhv high voltage programming voltage from passing on to the respective Vphv and Vnhv programming high voltages. Each high voltage switch Vphv and Vnhv turns ON whenever the respective input voltages Vpi and Vni are higher then the respective stored voltages Vpo and Vno. Each high voltage switch Vphv and Vnhv turns Off whenever the respective input voltages Vpi and Vni are lower then the respective stored voltages Vpo and Vno. The decode network selects the proper pair of differential storage cells under the control of the channel select inputs (CS2-CS0) for voltage storage. The support circuit block generates the proper high voltage programming voltage Vhv for programming the differential storage cells. The voltage reference block generates the Vref voltage. The differential to single ended convertors take pairs of Vpo and Vno voltages from each pair of the differential storage cells and generate the single ended voltages Vse. The single ended voltages Vse then go to the analog output buffers. The analog output buffers then provide buffered outputs CH. For each pair of differential storage cells there is one differential to single ended convertor and one analog output buffer. The differential to single ended converters use the following relationship to generate the single ended outputs Vse:

Vse=½ AV (Vpi−Vpn)+Vref

Av=same attenuation factor as used in the single ended to differential network

Through the above relationship, the single ended output becomes equal to the sampled analog voltage (Vse=Vsh).

Figure 9:
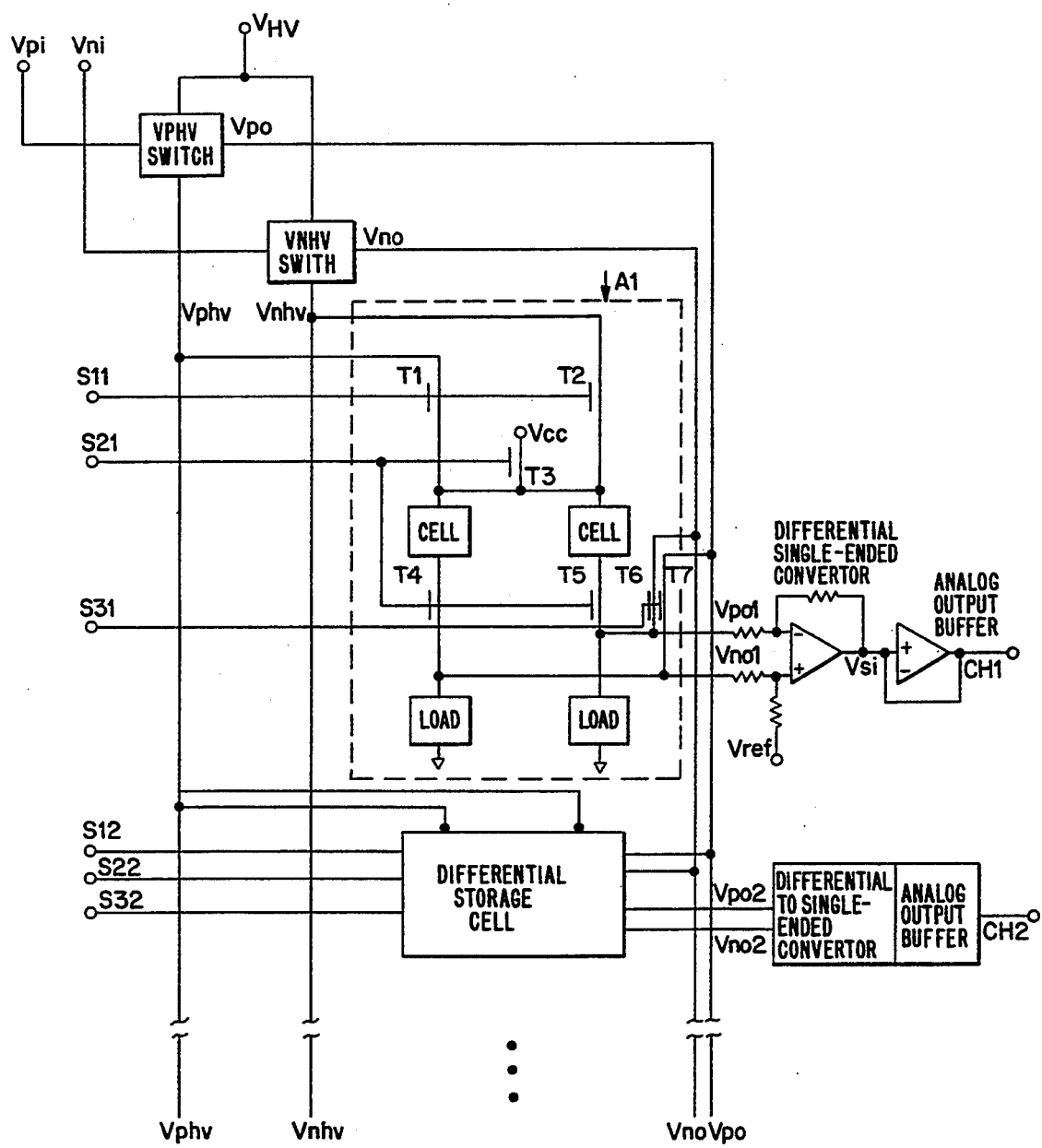
FIG. 9 shows a detailed schematic of the program write, read back path and a normal read back path of a pair of differential storage cells.

FIG. 9 shows a detailed schematic of the program write, read back path and a normal read back path of a pair of differential storage cells. The circuitry in the dotted block A1 is common to all the differential storage cells. The Vphv and Vnhv high voltage switches provide the Vphv and Vnhv high voltage programming voltages to the selected differential storage cells. Vpo and Vno lines provide the read back stored voltages from the selected differential storage cells and get compared to the Vpi and Vni voltages to either turn ON the high voltage switches or turn OFF the high voltage switches. The S11, S21, S31 are decoded signals from the decode logic. S11 allows the high voltage programming voltages to pass on to the storage cells. S21 provides the Vcc voltage to the storage cells when the storage cells are in the read back mode through transistor T3 and also equal current loads through transistors T4 and T5. Voltages S11 and S21 are mutually exclusive, meaning that both are not active at the same times. S31 is active only during the programming read back mode and not during normal read back mode. During a programming sequence the selected pair of storage cells is erased by providing the proper high voltages to the storage cells. Thereafter, through a repeated incremental high voltage program pulse and program read back sequence, the storage cells are programmed. The incremental high voltages Vphv and Vnhv are respectively applied to the storage cells, then the voltage stored is read back as Vpo and Vno. The voltages Vpi, Vni and Vpo are compared respectively at the high voltage switches and the incremental programming continued independently for each of the cells until the read back voltages Vpo, Vno equal the input voltages Vpi, Vni respectively. At this point, the pair of differential storage cells are placed in the normal read back mode by having S21 active and S11, S31 inactive. In the normal read back mode, the read back voltages Vpo1 and Vno1 pass to the differential to single ended convertor and generate the voltage Vse. The Vse then passes to the analog output buffer to provide the voltage CH1. Transistors T1-T7 are N channel enhancement devices.

Figure 10:
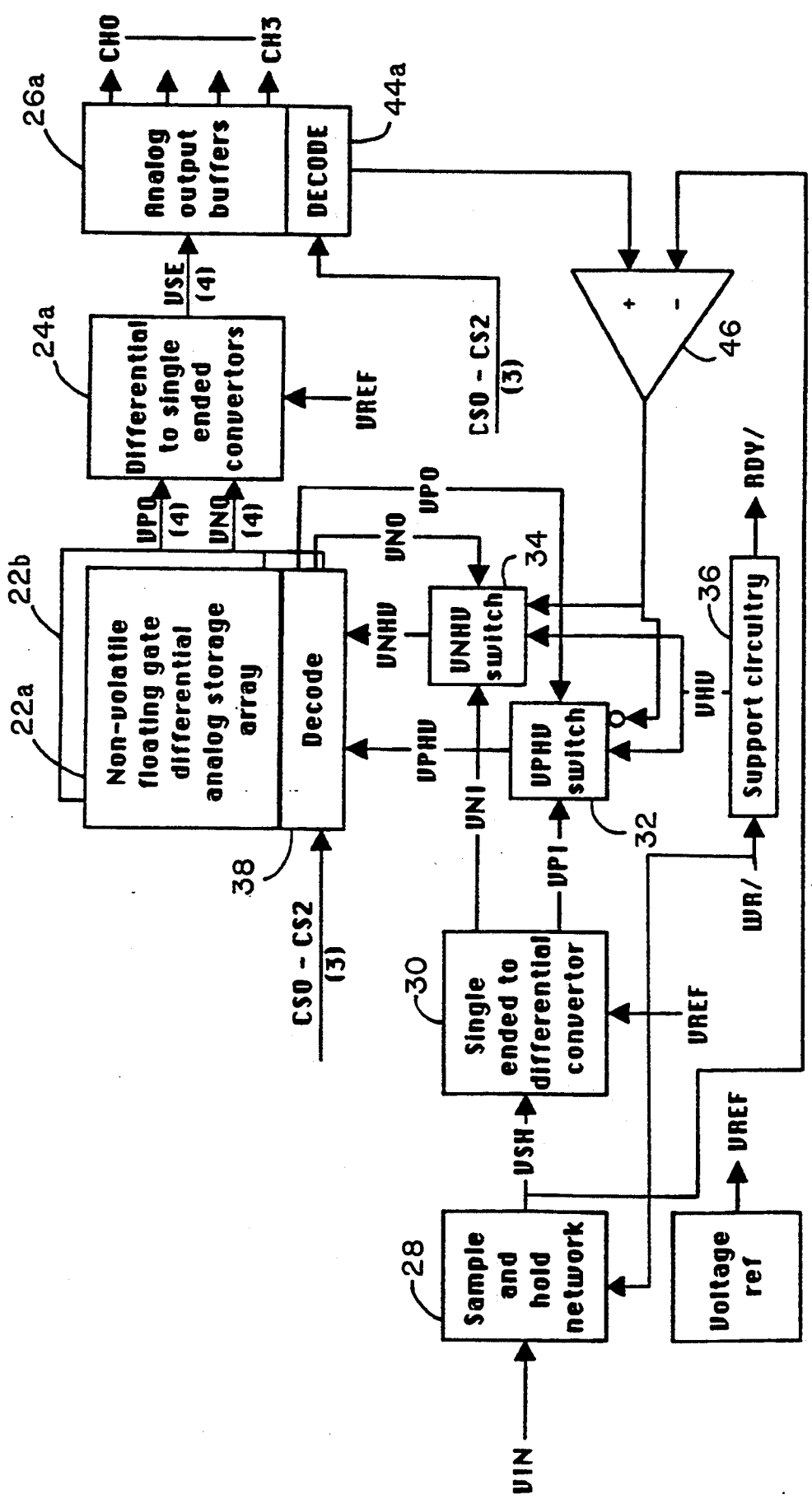
FIG. 10 is a block diagram of another preferred embodiment wherein an additional loop is provided which compares the output CH of the selected analog buffer to the sample and held voltage VSH, used in an additional programming sequence to achieve finer resolution and accuracy.

In the embodiment shown in the block diagram of FIG. 10, an additional loop is provided which compares the output CH of the selected analog buffer to the sample and held voltage VSH. This loop will be used in an additional programming sequence to achieve finer resolution and accuracy. As described above for the first programming sequence, after the individual cells of a pair of differential storage cells have been programmed to the respective voltages Vpo and Vno, the selected channel output CH is compared to the sampled and held voltage VSH, and depending on the output of the comparator 46 the proper cell is programmed with a finer incremental set of programming high voltages. Finer incremental programming voltages are applied to the proper cell and the CH output compared to the voltage VSH between each incremental high voltage application until the output of the comparator 46 switches. Note that during this time the cell which is not receiving the finer incremental high voltage, does indeed receive the same final high voltage as was applied to it during the first sequence of high voltage programming. The programming sequence can again be repeated with even a finer incremental step of high voltage programming until the comparator 46 switches again. These additional sequences provide higher output voltage resolution and the comparison of the analog buffer output CH to sampled and held voltage VSH nullifies any output path offsets and provides better accuracy to the analog output voltage CH.

While various preferred and alternate embodiments of the present invention have been disclosed and described herein in detail, it will be obvious to those skilled in the art that various changes in form and detail may be made therein without departing from the spirit and scope thereof.

I claim:

1. A programmable non-volatile analog voltage source comprising, in a single integrated circuit:
   a pair of electrically erasable floating gate differential analog voltage storage cells for storing an analog voltage as a difference between a pair of voltages stored in the differential analog voltage storage cells, and for providing as an output at least one analog voltage output in response thereto;
   buffer means responsive to the output of the differential analog voltage storage cells to provide a low impedance analog output in response thereto; and,
   write means responsive to a write signal to cause an analog voltage input to be stored in the pair of electrically erasable floating gate differential analog voltage storage cells.

2. The programmable non-volatile analog voltage source of claim 1 wherein said buffer means includes an enable buffer means for enabling and disabling the buffer means output.

3. A programmable non-volatile analog voltage source comprising, in a single integrated circuit:
   a nonvolatile analog sample storage array for storing a plurality of analog voltages in an equal plurality of analog voltage storage locations and for providing as an output at least one analog voltage output in response thereto, said analog sample storage array including pairs of storage elements, said analog voltages being stored as differences between voltages maintained by said pairs of elements;
   addressing means for directing an analog voltage input signal to one of said plurality of analog voltage storage locations of said nonvolatile analog sample storage array dependent upon an input to the addressing means; and,
   write means responsive to a write signal to cause an analog voltage input to be stored in one of said plurality of analog voltage storage locations of said nonvolatile analog sample storage array dependent upon the then current input to the addressing means.

4. The programmable non-volatile analog storage source of claim 3, wherein a first of said pair stores a positive voltage value and a second of said pair stores a negative voltage value, and wherein the stored positive and negative voltages are selected such that a difference between the stored positive and negative voltages represents said analog voltage.

5. The programmable non-volatile analog storage source of claim 3, wherein a first of said pair stores a positive voltage value and a second of said pair stores a reference voltage value, and wherein the stored positive and reference voltages are selected such that a difference between the stored positive and reference voltages represents said analog voltage.

6. A programmable non-volatile analog voltage source comprising, in a single integrated circuit:
   a nonvolatile analog sample storage array for storing a plurality of analog voltages in an equal plurality of analog voltage storage locations and for providing as an output a plurality of parallel analog voltage outputs in response thereto;
   addressing means for directing an analog voltage input signal to a selected one of said plurality of analog voltage storage locations of said nonvolatile analog sample storage array with said selected location being identified by an input to the addressing means; and,
   write means responsive to a write signal to cause an analog voltage input to be stored in said selected analog voltage storage location of said nonvolatile analog sample storage array; and wherein
   each of the analog voltage storage locations in said nonvolatile analog sample storage array comprise differential analog voltage storage cells, whereby an analog voltage stored in said nonvolatile analog sample storage array is stored as two voltages, the difference between the two representing the stored analog voltage, and further comprising means responsive to the voltage of a single ended input signal for providing two voltages having a differential voltage responsive to the sampled voltage to said differential analog voltage storage cells.

7. A programmable non-volatile analog voltage source comprising, in a single-integrated circuit:
   a nonvolatile analog sample storage array for storing a plurality of analog voltages in an equal plurality of analog voltage storage locations and for providing as an output a plurality of parallel analog voltage outputs in response thereto;
   addressing means for directing an analog voltage input signal to a selected one of said plurality of analog voltage storage locations of said nonvolatile analog sample storage array with said selected location being identified by an input to the addressing means;

write means responsive to a write signal to cause an analog voltage input to be stored in said selected analog voltage storage location of said nonvolatile analog sample storage array; and a sample and hold circuit also responsive to the write signal for sampling the voltage of the analog input signal and temporarily holding at the output of the sample and hold circuit a voltage responsive to the sampled voltage, and wherein said write means is responsive to the write signal to cause the analog voltage input as held in said sample and hold circuit to be stored in one of said plurality of analog voltage storage locations of said nonvolatile analog sample storage array dependent upon the then current input to the addressing means.

8. The programmable non-volatile analog voltage source of claim 7 wherein each of the analog voltage storage locations in said nonvolatile analog sample storage array comprise differential analog voltage storage cells, whereby an analog voltage stored in said nonvolatile analog sample storage array is stored as two voltages, the difference between the two representing the stored analog voltage, and wherein the sample and hold circuit is responsive to a write signal for sampling the voltage of a single ended input signal and including means for temporarily holding two voltages having a differential voltage responsive to the sampled voltage.

9. The programmable non-volatile analog voltage source of claims 7 or 8 wherein said addressing means is a means for directing the output of said sample and hold circuit to one of said plurality of analog voltage storage locations of said nonvolatile analog sample storage array dependent upon a coded input to the addressing means, and wherein said addressing means further comprises decoding means to decode said coded input to select a respective one of said plurality of analog voltage storage locations of said nonvolatile analog sample storage array.

10. The programmable non-volatile analog voltage source of claim 7 wherein said analog voltage storage locations of said nonvolatile analog sample storage array are electrically erasable analog voltage storage cells.

11. The programmable non-volatile analog voltage source of claim 10 wherein said analog voltage storage locations of said nonvolatile analog sample storage array are floating gate storage cells.

12. The programmable non-volatile analog voltage source of claim 11 wherein said write means is first responsive to a write signal to erase the voltage stored in the respective analog voltage storage location of said nonvolatile analog sample storage array before causing an analog voltage input to be stored in the one of said plurality of analog voltage storage locations of said nonvolatile analog sample storage array.

13. The programmable non-volatile analog voltage source of any one of claim 7 wherein said nonvolatile analog sample storage array includes a plurality of buffer means for providing a plurality of low impedance analog voltage outputs in response thereto.

14. The programmable non-volatile analog voltage source of claim 13 wherein said buffer means includes an enable buffer means for enabling and disabling the buffer means outputs.

15. The programmable non-volatile analog voltage source of claim 13 wherein said programmable nonvolatile analog voltage source has a first plurality of analog voltage storage locations and wherein said plurality of buffer means for providing a plurality of buffered analog voltage outputs in response thereto is a second plurality of buffer means for providing a second plurality of buffered analog voltage outputs in response thereto, said first plurality being substantially larger in number than said second plurality, and further comprising means for selecting which second plurality of said first plurality of analog voltage storage locations are coupled to said second plurality of buffer means to provide said second plurality of buffered analog voltage outputs.

16. The programmable non-volatile analog voltage source of claim 15 wherein said first plurality is an integer number N times said second plurality, and wherein said means for selecting which second plurality of said first plurality of analog voltage storage locations are coupled to said second plurality of buffer means to provide said second plurality of buffered analog voltage outputs comprises said addressing means, whereby N pages of said first plurality of analog voltage storage locations may be addressed for providing any of N pages of said second plurality of buffered analog voltage outputs at a time.

17. A programmable non-volatile analog voltage source comprising, in a single integrated circuit:

a nonvolatile analog sample storage array for storing a plurality of analog voltages in an equal plurality of analog voltage storage locations and for providing as an output a plurality of parallel analog voltage outputs in response thereto;

addressing means for directing an analog voltage input signal to a selected one of said plurality of analog voltage storage locations of said nonvolatile analog sample storage array with said selected location being identified by an input to the addressing means;

write means responsive to a write signal to cause an analog voltage input to be stored in said selected analog voltage storage location of said nonvolatile analog sample storage array; and a means for providing an output signal indicative of the completion of a write operation by said write means.

18. A programmable non-volatile analog voltage source comprising, in a single integrated circuit:

a nonvolatile analog sample storage array for storing a plurality of analog voltages in an equal plurality of analog voltage storage locations and for providing as an output a plurality of parallel analog voltage outputs in response thereto;

addressing means for directing an analog voltage input signal to a selected one of said plurality of analog voltage storage locations of said nonvolatile analog sample storage array with said selected location being identified by an input to the addressing means;

write means responsive to a write signal to cause an analog voltage input to be stored in said selected analog voltage storage location of said nonvolatile analog sample storage array; and digital to analog convertor means for receiving a multi-bit parallel digital signal and converting said multi-bit parallel digital signal to an analog signal as said analog input signal to said write means.

19. The programmable non-volatile analog voltage source of claim 18 further comprised of register means for receiving a multi-bit serial digital signal and providing the same to said digital to analog convertor means as said multi-bit parallel digital signal.

20. A programmable non-volatile analog voltage source comprising, in a single integrated circuit:
   a nonvolatile analog sample storage array for storing a plurality of analog voltages in an equal plurality of analog voltage storage locations and for providing as an output a plurality of parallel analog voltage outputs in response thereto;
   addressing means for directing an analog voltage input signal to a selected one of said plurality of analog voltage storage locations of said nonvolatile analog sample storage array with said selected location being identified by an input to the addressing means; and,
   write means responsive to a write signal to cause an analog voltage input to be stored in said selected analog voltage storage location of said nonvolatile analog sample storage array; and wherein
      said nonvolatile analog sample storage array is a means for storing a first plurality of analog voltages,
      said addressing means is a means for directing a second plurality of analog voltage input signals to an equal plurality of analog voltage storage locations of said nonvolatile analog sample storage array dependent upon the input to the addressing means; and,
      said write means is responsive to a write signal to cause a second plurality of analog voltage inputs to be stored in a second plurality of said first plurality of analog voltage storage locations of said nonvolatile analog sample storage array dependent upon the then current input to the addressing means.

21. The programmable non-volatile analog voltage source of claim 20 wherein said first plurality is an integer number N times said second plurality, whereby any one of N pages of a second plurality of analog voltages may be simultaneously stored in the nonvolatile analog sample storage array at one time, and wherein any one of N pages of a second plurality of analog voltage outputs may be provided at one time by said nonvolatile analog sample storage array.

22. A programmable non-volatile analog voltage source comprising, in a single integrated circuit:
   a nonvolatile analog sample storage array for storing a plurality of analog voltages in an equal plurality of analog voltage storage locations and for providing as an output a plurality of parallel analog voltage outputs in response thereto;
   addressing means for directing an analog voltage input signal to a selected one of said plurality of analog voltage storage locations of said nonvolatile analog sample storage array with said selected location being identified by an input to the addressing means; and
   write means responsive to a write signal to cause an analog voltage input to be stored in said selected analog voltage storage location of said nonvolatile analog sample storage array; and wherein
      the addressing means includes means for providing an analog voltage input signal as an output for the respective one of the plurality of parallel analog voltage outputs dependent upon the input to the addressing means.

23. A programmable non-volatile analog voltage source comprising, in a single integrated circuit:
   a nonvolatile analog sample storage array for storing a plurality of analog voltages in an equal plurality of analog voltage storage locations and for providing as an output a plurality of parallel analog voltage outputs in response thereto;
   addressing means for directing an analog voltage input signal to a selected one of said plurality of analog voltage storage locations of said nonvolatile analog sample storage array with said selected location being identified by an input to the addressing means; and,
   write means responsive to a write signal to cause an analog voltage input to be stored in said selected analog voltage storage location of said nonvolatile analog sample storage array; and wherein
      the write means is responsive to a write signal to cause an analog voltage input to be compared with the analog voltage output of the respective analog voltage storage location and to provide a fine programming sequence in response thereto to cause the analog voltage input to be more accurately stored in the respective analog voltage storage location.

24. A method of providing a plurality of nonvolatile analog voltages comprising the steps of:
   (a) providing a nonvolatile analog sample storage array for storing a plurality of analog voltages in an equal plurality of analog voltage storage locations and providing as an output a plurality of parallel analog voltage outputs;
   (b) storing a plurality of analog voltages in selected analog voltage storage locations of the nonvolatile analog sample storage array; and,
   (c) statically reading out the plurality of analog voltages stored in the selected analog voltage storage locations of the nonvolatile analog sample storage array to provide a plurality of parallel analog voltage outputs; and wherein
      in step (a), each storage location in the nonvolatile analog sample storage array is a pair of differential analog voltage storage cells;
      in step (b), each analog voltage stored in the nonvolatile analog sample storage array is stored as two voltages, the difference between the two representing the stored analog voltage;
      and step (c) further includes the step of converting each pair of voltages to an analog voltage proportional to the difference between the respective pair of voltages.

25. A method of providing a plurality of nonvolatile analog voltages comprising the steps of:
   (a) providing a nonvolatile analog sample storage array for storing a plurality of analog voltages in an equal plurality of analog voltage storage locations and providing as an output a plurality of parallel analog voltage outputs;
   (b) storing a plurality of analog voltages in selected analog voltage storage locations of the nonvolatile analog sample storage array; and,
   (c) statically reading out the plurality of analog voltages stored in the selected analog voltage storage locations of the nonvolatile analog sample storage array to provide a plurality of parallel analog voltage outputs; and wherein in step (b), the analog voltages to be stored are first provided in digital form and then converted to analog form for storage; and in step (b), the analog voltages to be stored are provided in bit parallel digital form and then converted to analog form for storage.

26. The method of claim 25 wherein in step (b), the analog voltages to be stored are provided in bit serial digital form and then converted to bit parallel form and then to analog form for storage.

27. A method of providing a plurality of nonvolatile analog voltages comprising the steps of:
(a) providing a nonvolatile analog sample storage array for storing a plurality of analog voltages in an equal plurality of analog voltage storage locations and providing as an output a plurality of parallel analog voltage outputs;
(b) storing a plurality of analog voltages in selected analog voltage storage locations of the nonvolatile analog sample storage array; and,
(c) statically reading out the plurality of analog voltages stored in the selected analog voltage storage locations of the nonvolatile analog sample storage array to provide a plurality of parallel analog voltage outputs; and wherein
the plurality of analog voltage storage locations of step (a) is N times the plurality of parallel analog voltage outputs provided in step (c) at any one time, so that any of N pages of parallel analog voltage outputs may be selectively provided in step (c).

28. The method of claim 27 wherein in step (b), the plurality of analog voltages stored in the plurality of analog voltage storage locations of the nonvolatile analog sample storage array are stored a plurality at a time.

29. The method of claim 27 wherein the plurality of analog voltage storage locations of step (a) is N times the plurality of parallel analog voltage outputs provided in step (c) at any one time, so that any of N pages of parallel analog voltage outputs may be selectively provided in step (c).

30. A method of providing a plurality of nonvolatile analog voltages comprising the steps of:
(a) providing a nonvolatile analog sample storage array for storing a plurality of analog voltages in an equal plurality of analog voltage storage locations and providing as an output a plurality of parallel analog voltage outputs;
(b) storing a plurality of analog voltages in selected analog voltage storage locations of the nonvolatile analog sample storage array;
(c) statically reading out the plurality of analog voltages stored in the selected analog voltage storage locations of the nonvolatile analog sample storage array to provide a plurality of parallel analog voltage outputs; and
(d) providing an analog voltage input signal to be stored as an output for the respective one of the plurality of parallel analog voltage outputs dependent upon the input to the addressing means.

31. A method of providing a plurality of nonvolatile analog voltages comprising the steps of:
(a) providing a nonvolatile analog sample storage array for storing a plurality of analog voltages in an equal plurality of analog voltage storage locations and providing as an output a plurality of parallel analog voltage outputs;
(b) storing a plurality of analog voltages in selected analog voltage storage locations of the nonvolatile analog sample storage array;
(c) statically reading out the plurality of analog voltages stored in the selected analog voltage storage locations of the nonvolatile analog sample storage array to provide a plurality of parallel analog voltage outputs; and wherein
during the storing of an analog voltage, the analog voltage is compared with the analog voltage output of the respective analog voltage storage location and a fine programming sequence is conducted in response thereto to cause the analog voltage input to be more accurately stored in the respective analog voltage storage location.

32. A programmable non-volatile analog voltage source comprising, in a single integrated circuit:
a nonvolatile analog sample storage array for storing a plurality of analog voltages in an equal plurality of analog voltage storage locations and for providing as an output at least one analog voltage output in response thereto;
addressing means for directing an analog voltage input signal to a selected one of said plurality of analog voltage storage locations of said nonvolatile analog sample storage array with said selected location being identified by an input to the addressing means; and,
write means responsive to a write signal to cause an analog voltage input to be stored in said selected analog voltage storage location of said nonvolatile analog sample storage array; and wherein
each of the analog voltage storage locations in said nonvolatile analog sample storage array comprise differential analog voltage storage cells, whereby an analog voltage stored in said nonvolatile analog sample storage array is stored as two voltages, the difference between the two representing the stored analog voltage, and further comprising means responsive to the voltage of a single ended input signal for providing two voltages having a differential voltage responsive to the sampled voltage to said differential analog voltage storage cells.

33. The programmable non-volatile analog voltage source of claim 32 wherein the addressing means is also a means for determining which of the stored plurality of analog voltages is provided as the output of the nonvolatile analog sample storage array.

34. The programmable non-volatile analog voltage source of claim 32 wherein the addressing means is also a means for determining which of the stored plurality of analog voltages is provided as the output of the nonvolatile analog sample storage array.

35. The programmable non-volatile analog voltage source of claim 32 wherein said analog voltage storage locations of said nonvolatile analog sample storage array are electrically erasable floating gate storage cells, and wherein said write means is first responsive to a write signal to erase the voltage stored in the respective analog voltage storage location of said nonvolatile analog sample storage array before causing an analog voltage input to be stored in the one of said plurality of analog voltage storage locations of said nonvolatile analog sample storage array.

36. The programmable non-volatile analog voltage source of claim 35 wherein said nonvolatile analog sample storage array includes a buffer means for providing a plurality of low impedance analog voltage output in response thereto, and wherein said buffer means includes an enable buffer means for enabling and disabling the buffer means output.

37. The programmable non-volatile analog voltage source of claim 32 or 33 wherein the addressing means includes means for providing an analog voltage input signal as an output for the respective one of the plurality of parallel analog voltage outputs dependent upon the input to the addressing means.

38. The programmable non-volatile analog voltage source of claim 32 or 35 wherein the write means is responsive to a write signal to cause an analog voltage input to be compared with the analog voltage output of the respective analog voltage storage location and to provide a fine programming sequence in response thereto to cause the analog voltage input to be more accurately stored in the respective analog voltage storage location.

* * * * *

UNITED STATES PATENT AND TRADEMARK OFFICE
CERTIFICATE OF CORRECTION

PATENT NO. : 5,388,064
DATED : February 7, 1995
INVENTOR(S) : Khan

It is certified that error appears in the above-identified patent and that said Letters Patent is hereby corrected as shown below:

In column 2 at line 16 change "operable" to --operate--.

Signed and Sealed this

Fourth Day of July, 1995

*Attest:*

BRUCE LEHMAN

*Attesting Officer*     *Commissioner of Patents and Trademarks*